United States Patent
Chou et al.

(10) Patent No.: US 12,415,749 B2
(45) Date of Patent: Sep. 16, 2025

(54) METHOD FOR MANUFACTURING ULTRA-THIN GLASS SUBSTRATES AND METHOD FOR MANUFACTURING DISPLAY PANEL

(71) Applicant: Flexi Glass Co., Ltd., Bozhou (CN)

(72) Inventors: Hao-Yu Chou, Bozhou (CN);
Cheng-Chung Chiang, Bozhou (CN);
Tian-Ming Wu, Bozhou (CN);
Chun-Chieh Huang, Bozhou (CN);
Feng Chen, Bozhou (CN)

(73) Assignee: Flexi Glass Co., Ltd., Bozhou (CN)

( * ) Notice: Subject to any disclaimer, the term of this patent is extended or adjusted under 35 U.S.C. 154(b) by 341 days.

(21) Appl. No.: 18/032,025

(22) PCT Filed: Nov. 18, 2020

(86) PCT No.: PCT/CN2020/129699
§ 371 (c)(1),
(2) Date: Apr. 14, 2023

(87) PCT Pub. No.: WO2022/088294
PCT Pub. Date: May 5, 2022

(65) Prior Publication Data
US 2023/0391661 A1    Dec. 7, 2023

(30) Foreign Application Priority Data
Oct. 26, 2020    (CN) .......................... 202011157008.0

(51) Int. Cl.
*C03C 15/00*    (2006.01)
*H10K 59/12*    (2023.01)

(52) U.S. Cl.
CPC ......... *C03C 15/00* (2013.01); *H10K 59/1201* (2023.02)

(58) Field of Classification Search
None
See application file for complete search history.

(56) References Cited

U.S. PATENT DOCUMENTS 3,373,064 A * 3/1968 Junge ..................... H01J 29/24
    156/345.19
3,616,048 A * 10/1971 Bresciani ............... C03C 15/00
    156/345.23
(Continued)

FOREIGN PATENT DOCUMENTS

CN    102108009 A    6/2011
CN    102145979 A    8/2011
(Continued)

OTHER PUBLICATIONS

Chinese Office Action for Chinese Application No. 202011157008.0 dated Apr. 23, 2021 (9 pages).
(Continued)

*Primary Examiner* — Shamim Ahmed
(74) *Attorney, Agent, or Firm* — REISING ETHINGTON, P.C.

(57) ABSTRACT

A method for manufacturing ultra-thin glass substrates and a method for manufacturing a display panel are provided. The method for manufacturing ultra-thin glass substrates includes: providing a glass base material preset with n substrate areas and a skeleton area surrounding the substrate areas; at least forming an etching protection layer on each substrate area of the glass base material; immersing the glass base material in a reaction chamber having etching medium; after the edge of each substrate area is etched to form the stress dissipation edge and the substrate areas are separated from the glass base material, the substrate areas falling down by gravity and falling into the basket; pulling the basket out of the reaction chamber to get the substrate areas separated (Continued)

from the glass base material; removing the etching protection layer to get independent glass substrates.

10 Claims, 35 Drawing Sheets

(56) References Cited

U.S. PATENT DOCUMENTS

| | | |
|---|---|---|
| 2011/0028305 A1 | 2/2011 | Lim et al. |
| 2012/0146922 A1 | 6/2012 | Kang et al. |
| 2023/0071528 A1* | 3/2023 | Eo .................. H10K 59/12 |

FOREIGN PATENT DOCUMENTS

| | | |
|---|---|---|
| CN | 103108842 A | 5/2013 |
| CN | 203079843 U | 7/2013 |
| CN | 103304154 A | 9/2013 |
| CN | 103482878 A | 1/2014 |
| CN | 103508663 A | 1/2014 |
| CN | 104105674 A | 10/2014 |
| CN | 106547134 A | 3/2017 |
| CN | 108516692 A | 9/2018 |
| CN | 109133661 A | 1/2019 |
| CN | 109407372 A | 3/2019 |
| CN | 110482851 A | 11/2019 |
| CN | 111285612 A | 6/2020 |
| CN | 111453997 A | 7/2020 |
| JP | 2010006644 A | 1/2010 |
| JP | 2014084266 A | 5/2014 |
| KR | 20170019698 A | 2/2017 |
| WO | WO2015105164 A1 | 7/2015 |
| WO | WO2018135565 A1 | 7/2018 |
| WO | WO2018216612 A1 | 11/2018 |

OTHER PUBLICATIONS

English Translation of Chinese Office Action for Chinese Application No. 202011157008.0 dated Apr. 23, 2021 (8 pages).
International Search Report for International Application No. PCT/CN2020/129699 dated Jul. 30, 2021 (39 pages).
Chinese Notice of Allowance for Chinese Application No. 202011157008.0 dated Oct. 22, 2021 (4 pages).
English Translation of Chinese Notice of Allowance for Chinese Application No. 202011157008.0 dated Oct. 22, 2021 (2 pages).

* cited by examiner

METHOD FOR MANUFACTURING ULTRA-THIN GLASS SUBSTRATES AND METHOD FOR MANUFACTURING DISPLAY PANEL

CROSS-REFERENCE TO RELATED APPLICATIONS

This application is based upon PCT patent application No. PCT/CN2020/129699, filed on Nov. 18, 2020, which claims priority to Chinese Patent Applications No. 202011157008.0, filed on Oct. 26, 2020, the entire contents of which are incorporated herein by reference.

TECHNICAL FIELD

The present disclosure relates to technology of manufacturing a display panel, and more particularly to a method for manufacturing ultra-thin glass substrates and a method for manufacturing a display panel.

BACKGROUND

Ultra-thin glass substrates (UTG substrates) are important parts of flexible cover plates. The quality of the ultra-thin glass substrates is key to realizing a smaller bending radius that is close or equal to 2 mm. Especially when the UTG substrate is cut to a certain size, the edge needs to be specially processed to overcome the defects, such as edge breakages, microcracks, etc. caused by cutting, to prevent the substrate from being cracked during being bent for the defects. In general, two aspects of problems are needed to be solved: (1) using which kind of cutting method to achieve a relatively straight edge, (2) using a processing method such as polishing to overcome the edge defects.

Nowadays, scribing wheel cutting is limited to linear cutting. It's still hard to use the scribing wheel cutting for irregular cutting (such as edge fillet). Furthermore, the UTG substrate without chemical reinforcing processing and having a thickness of about 100 um is very fragile, and will easily generate fragments of high proportion or unexpected defects, such as edge breakages, microcracks, etc., when being under the pressure of the scribing wheel. These defects are fatal to the following edge polishing and could directly cause the substrate to be scrapped. Therefore, it's important to achieve a substrate with a straight edge using an appropriate cutting method.

Compared with the scribing wheel cutting, laser cutting without mechanical forces can realize a better edge-cutting effect and maybe a main cutting method for future ultra-thin glass substrates, the laser cutting means using the energy released when a laser beam irradiates on a surface of a workpiece to melt and evaporate a part of the workpiece, so as to cut the workpiece to several pieces. The laser cutting applies no pressure on the surface of the glass. Therefore, the glass substrate will not be damaged, and the laser cutting can be applied for different kinds of irregular cutting.

On the other hand, during the processing and transporting of the UTG substrates, quality defects are easy to occur, such as the scratch to the surface of the glass or the damage caused by extruding with each other. Nowadays, a protection ink layer is sprayed on the two surfaces of the glass to reduce or eliminate the occurrence of the above defects. The manufacturing process includes: cutting a large sheet of UTG base material, edge polishing, chemical reinforcing, and spraying a protection ink layer. At last, function layers can be coated on the UTG substrates processed by the chemical reinforcing, to form a flexible cover plate.

Therefore, a general manufacturing method of an ultra-thin glass substrate includes: spraying a protection layer on the UTG substrate, laser cutting the UTG substrate to get a desired size, and then performing following manufacturing process. However, it's a tough task to spray the ink uniformly on the surface of the UTG substrate, for it's hard to eliminate bubbles, make sure the film layer has a uniform thickness and a uniform color, and make sure the spraying environment is clean, etc. Meanwhile, during the laser cutting process, the laser often has the problem of scattering for the cutting path may not be sprayed uniformly, then the glass is not thoroughly cut, and the defects, such as the glass being hard to be separated into pieces or seriously edge breakages, etc. may occur, which will seriously affect the following edge polishing process.

SUMMARY

To overcome the defects of the existing technology, an embodiment of the present disclosure provides a method for manufacturing ultra-thin glass substrates which avoids the damage caused by scribing wheel cutting and laser cutting to the ultra-thin glass substrate, simplifies the manufacturing steps of the glass substrate, and speeds up the manufacturing process of the ultra-thin substrate. The stress dissipation effects of the edge of the ultra-thin glass substrate are enhanced and the product quality of the ultra-thin glass substrate is improved.

In an embodiment of the present disclosure, a method for manufacturing ultra-thin glass substrates is provided, including the following steps:

S410: providing a glass base material preset with n substrate areas and a skeleton area surrounding the substrate areas, wherein n is greater than or equal to 2;

S420: at least forming an etching protection layer on each of an upper surface and a lower surface of the substrate areas of the glass base material, respectively;

S430: immersing the glass base material having the etching protection layer in a reaction chamber having etching medium, wherein the reaction chamber further includes a plurality of support members to support the glass base material and a basket located under the support members along the gravity direction, the support members support the skeleton area of the glass base material, and the etching medium at least etches the skeleton area of the glass base material;

S440: after the edge of each substrate area is etched to form the stress dissipation edge and the substrate areas are separated from the glass base material, the substrate areas falling down by gravity, passing through the passages between the support members and falling into the basket;

S460: pulling the basket out of the reaction chamber to get the substrate areas separated from the glass base material;

S470: removing the etching protection layer to get independent glass substrates.

In some embodiments, the support members only support the skeleton area of the glass base material, the basket has through holes used for the support members passing through, a first projection area of each gap between the support members on the basket is larger than or equal to a second projection area of each substrate area on the basket.

In some embodiments, the etching protection layer only covers the upper surface and the lower surface of each substrate area, an upper surface and a lower surface of the skeleton area are both not covered by the etching protection layer.

In some embodiments, the step S420 comprises following steps:

S421: forming a polymeric reinforcing layer on at least one side of the upper surface and the lower surface of each substrate area of the glass base material, wherein components of the polymeric reinforcing layer comprise acrylic, organic polymer material containing silicon, epoxy resin, fluororesin, polyamide, polyimide, polycarbonate, polyethylene terephthalate and poly-1,4-cyclohexanedimethyl terephthalate;

S422: forming the etching protection layer on one side of the polymeric reinforcing layer away from the substrate areas.

In some embodiments, the step S420 comprises following steps:

S423: forming a panel function layer on at least one side of the upper surface and the lower surface of each substrate area of the glass base material, wherein the panel function layer comprises one of a TFT rear panel, an organic light emitting layer, a touch detection layer, a fingerprint identification layer, and a cover plate or a combination thereof;

S424: forming an etching protection layer on one side of the panel function layer away from the substrate areas.

In some embodiments, by using a first etching process, the whole skeleton area of the glass base material is removed, and the substrate areas protected by the etching protection layer are reserved;

by using a second etching process, the stress dissipation edge is formed along the edge of each substrate area;

or, by using one etching process, the whole skeleton area of the glass base material is removed, and the stress dissipation edge is formed along the edge of each substrate area.

In some embodiments, the substrate areas are arranged in a matrix arrangement on the glass base material, adjacent substrate areas are separated from each other by the skeleton area;

the stress dissipation edge is a circular-arc edge, a blade edge, or a polygonal edge, the blade edge or the polygonal edge comprises at least one straight hypotenuse or arcuate hypotenuse, an angle between the hypotenuse and the glass base material ranges from 15° to 90;

a thickness of the glass base material ranges from 10 um to 150 um;

the stress dissipation edge surrounds the edge of each substrate area, and a width of the stress dissipation edge ranges from 5 um to 300 um.

In some embodiments, the following step is performed after the step S440, and before the step S460:

S450: detecting whether all the substrate areas are separated from the glass base material and fall into the basket, if yes, then processing the step S460, if not, then processing the step S450.

In some embodiments, the method further comprises a step S480 after the step S470: forming a polymeric reinforcing layer on at least one side of an upper surface and a lower surface of the glass substrate, wherein components of the polymeric reinforcing layer comprise acrylic, organic polymer material containing silicon, epoxy resin, fluororesin, polyamide, polyimide, polycarbonate, polyethylene terephthalate and poly-1,4-cyclohexanedimethyl terephthalate.

The present disclosure further provides a method for manufacturing a display panel including the above method for manufacturing ultra-thin glass substrates.

The aim of the present disclosure, per an embodiment, is providing a method for manufacturing ultra-thin glass substrates which avoids the damage caused by scribing wheel cutting and laser cutting to the ultra-thin glass substrate, simplifies the manufacturing steps of the glass substrate, and speeds up the manufacturing process of the ultra-thin substrate. The stress dissipation effects of the edge of the ultra-thin glass substrate are enhanced and the product quality of the ultra-thin glass substrate is improved.

BRIEF DESCRIPTION OF THE DRAWINGS

The foregoing and other features, and advantages of the invention are apparent from the following detailed description taken in conjunction with the accompanying drawings in which.

DETAILED DESCRIPTION

In the following, embodiments of the present disclosure will be described in detail with reference to the figures. The concept of the present disclosure can be implemented in a plurality of forms, and should not be understood to be limited to the embodiments described hereafter. In the contrary, these embodiments are provided to make the present disclosure more comprehensive and understandable, and so the conception of the embodiments can be conveyed to those skilled in the art fully. Same reference signs in the figures refer to same or similar elements, so repeated descriptions of them will be omitted.

Figure 1:
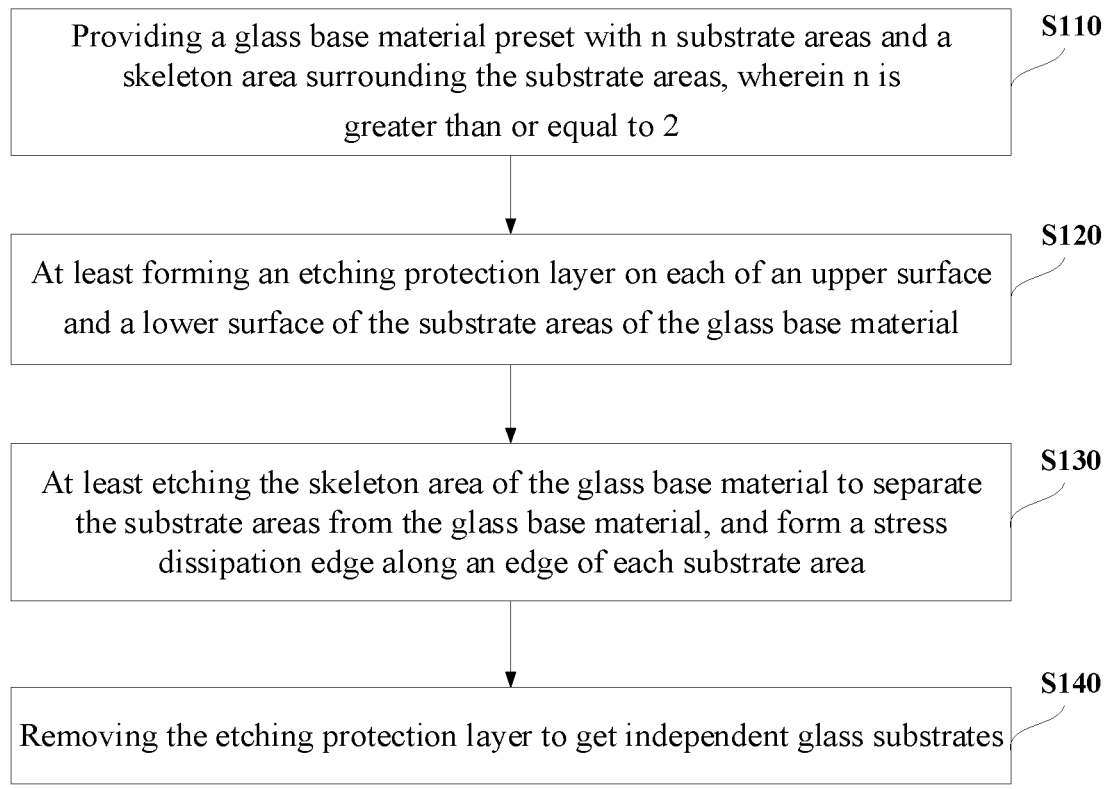
FIG. 1 is a flow chart showing a first kind of the method for manufacturing ultra-thin glass substrates of an embodiment of the present disclosure.

FIG. 1 is a flow chart showing a first kind of the method for manufacturing ultra-thin glass substrates of the present disclosure. As shown in FIG. 1, the method for manufacturing ultra-thin glass substrates of an embodiment of the present disclosure includes following steps:

S110: providing a glass base material 1 preset with n substrate areas 11 and a skeleton area 12 surrounding the substrate areas 11, wherein n is greater than or equal to 2, a thickness of the glass base material 1 ranges from 10 um to 150 um;

S120: at least forming an etching protection layer on each of an upper surface and a lower surface of the substrate areas 11 of the glass base material 1;

S130: at least etching the skeleton area 12 of the glass base material 1 to separate the substrate areas 11 from the glass base material 1, and form a stress dissipation edge 13 along an edge of each substrate area 11; in the embodiment, the etching is performed by dry etching or wet etching of chemical etching;

S140: removing the etching protection layer to get independent glass substrates 14.

During the manufacturing process of an embodiment of the present disclosure, scribing wheel and laser are not needed, therefore damage caused by scribing wheel cutting or laser cutting to quality of the ultra-thin glass substrates can be prevented, steps of manufacturing the glass substrates are simplified, processing speed of the glass substrates is accelerated, and stress dissipation effects of the edges of the ultra-thin glass substrates are reinforced, and the quality of the ultra-thin glass substrate is improved.

In an embodiment, the step S120 includes the following steps:

S121: forming a polymeric reinforcing layer 24 on at least one side of the upper surface and the lower surface of each substrate area 11 of the glass base material, wherein components of the polymeric reinforcing layer 24 include acrylic, organic polymer material containing silicon (silane, silicone, silicon rubber), epoxy resin, fluororesin, polyamide, polyimide, polycarbonate (PC), polyethylene terephthalate (PET) and poly-1,4-cyclohexanedimethyl terephthalate (PCT);

S122: forming the etching protection layer on one side of the polymeric reinforcing layer 24 away from the substrate areas 11, so that the flexibility of the whole glass substrate 14 is enhanced, and the glass substrate 14 can be better prevented from fragmentation when the glass substrate 14 is bent and recovered.

In an embodiment, the step S120 includes following steps:

S123: forming a panel function layer 23 on at least one side of the upper surface and the lower surface of each substrate area 11 of the glass base material, wherein the panel function layer 23 includes one of a TFT rear panel, an organic light emitting layer, a touch detection layer, a fingerprint identification layer, and a cover plate or a combination thereof;

S124: forming an etching protection layer on one side of the panel function layer 23 away from the substrate areas 11.

In an embodiment, by using a first etching process, the whole skeleton area 12 of the glass base material 1 is removed, and the substrate areas 11 protected by the etching protection layer are reserved. By using a second etching process, the stress dissipation edge 13 is formed along the edge of each substrate area 11.

In an embodiment, by using one etching process, the whole skeleton area 12 of the glass base material 1 is removed, and the stress dissipation edge 13 is formed along the edge of each substrate area 11, but the present disclosure is not limited to this.

In an embodiment, the etching protection layer only covers the upper surface and the lower surface of each substrate area 11, an upper surface and a lower surface of the skeleton area 12 are both not covered by the etching protection layer, but the present disclosure is not limited to this.

In an embodiment, one side of the glass base material 1 is fully covered by the etching protection layer, on the other side of the glass base material 1, only the substrate areas 11 are covered by the etching protection layer, and the skeleton area 12 is not covered by the etching protection layer, but the present disclosure is not limited to this.

In an embodiment, the etching is performed with acid liquid, for example, the acid liquid is one of the following kinds of solutions: (1) HF+H2SO4+CH3COOH, (2) HF+HNO3+H2O, (3) HF+H2O+NHAF, which is mixed with HF as a main part, a solution mixed with ammonia fluoride or sodium fluoride as a main part and added with HCL, or an acetic acid solution. In an alternative embodiment, the etching can also be performed with an alkaline liquid such as phosphate+alkaline solution, or the etching can also be performed in a way of plasma etching or abrasive blasting.

In an embodiment, the substrate areas 11 are arranged in a matrix arrangement, and adjacent substrate areas 11 are separated from each other by the skeleton area 12, but the present disclosure is not limited to this.

In an embodiment, the stress dissipation edge 13 is a circular-arc edge, a blade edge, or a polygonal edge, the blade edge or the polygonal edge includes at least one straight hypotenuse or arcuate hypotenuse, an angle between the hypotenuse and the glass base material 1 ranges from 15° to 90°, but the present disclosure is not limited to this.

In an embodiment, a thickness of the glass base material 1 ranges from 10 um to 150 um, but the present disclosure is not limited to this.

In an embodiment, the stress dissipation edge 13 surrounds the edge of each substrate area 11, and a width of the stress dissipation edge 13 ranges from 5 um to 300 um, but the present disclosure is not limited to this.

The present disclosure, per an embodiment, further provides a method for manufacturing a display panel, including the above method for manufacturing ultra-thin glass substrates.

FIGS. 2-11 are schematic views of a first kind of manufacturing process of the method for manufacturing ultra-thin glass substrates of an embodiment of the present disclosure. As shown in FIGS. 2-11, the first kind of manufacturing process of the ultra-thin glass substrate 14 includes the following processes.

Figure 2:
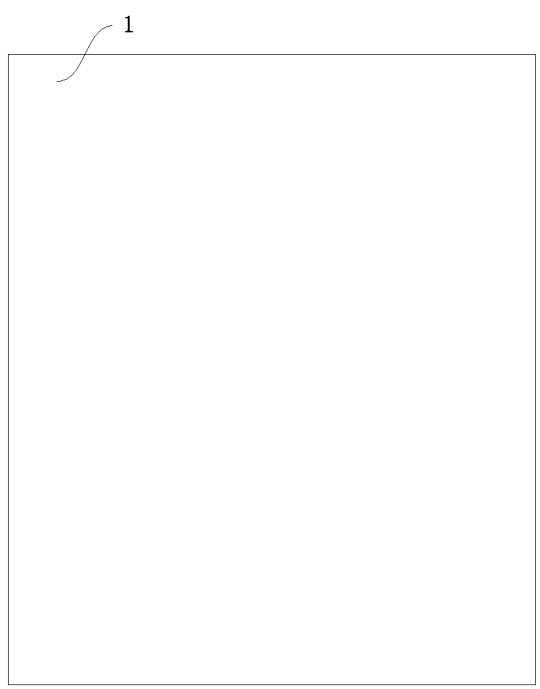
FIGS. 2-11 are schematic views of a first kind of manufacturing process of the method for manufacturing ultra-thin glass substrates of an embodiment of the present disclosure.

As shown in FIG. 2, firstly, a glass base material 1 is provided, the width of the glass base material 1 ranges from 10 um to 150 um. A plurality of substrate areas 11 are arranged on the glass base material 1 in a matrix arrangement, and adjacent substrate areas 11 are separated from each other by a skeleton area 12.

Figure 3:
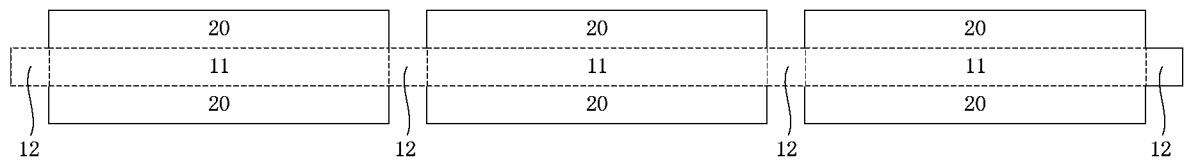
Figure 4:
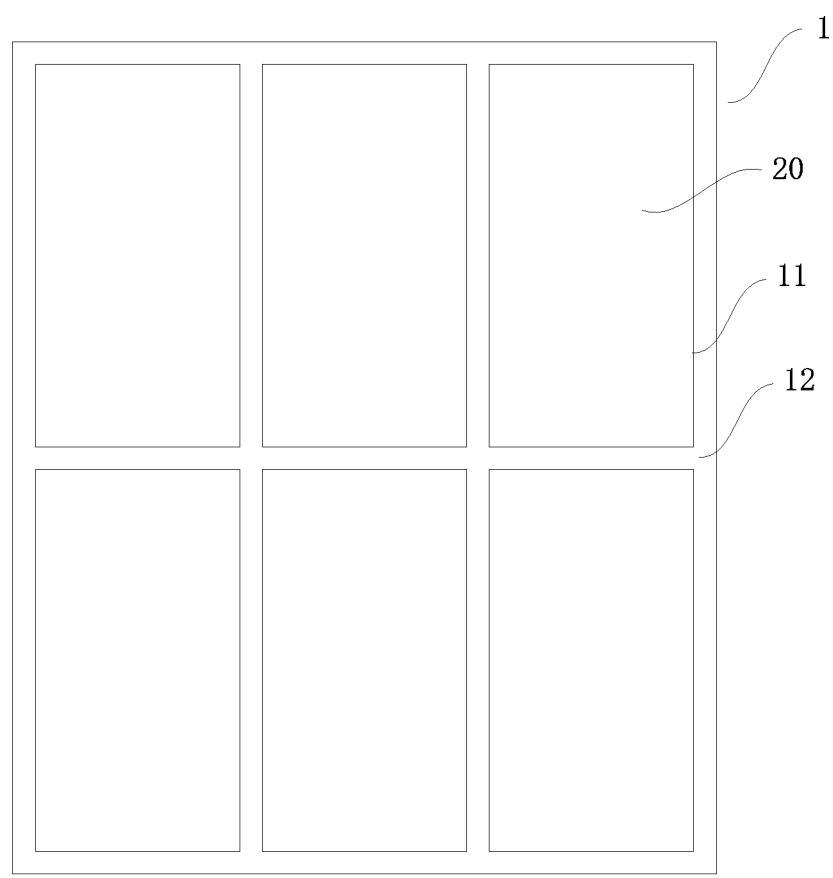
Figure 5:
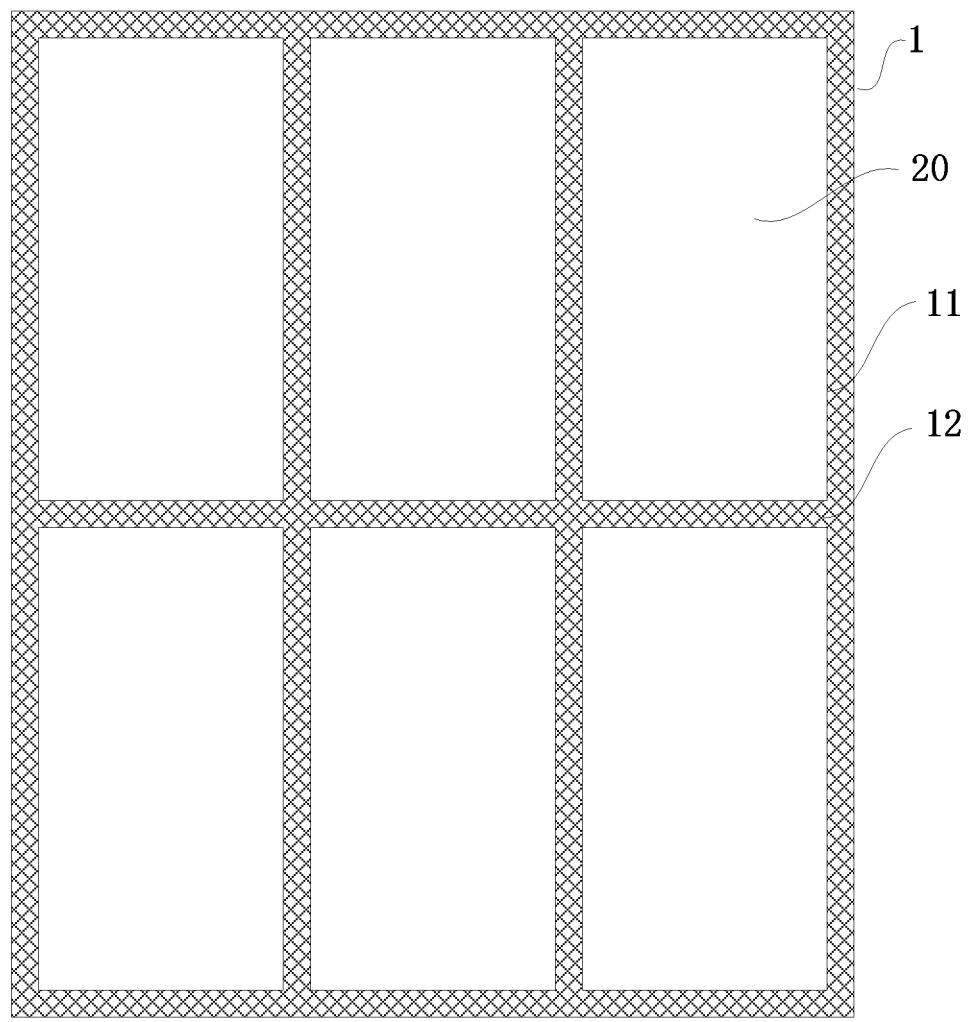
Figure 6:
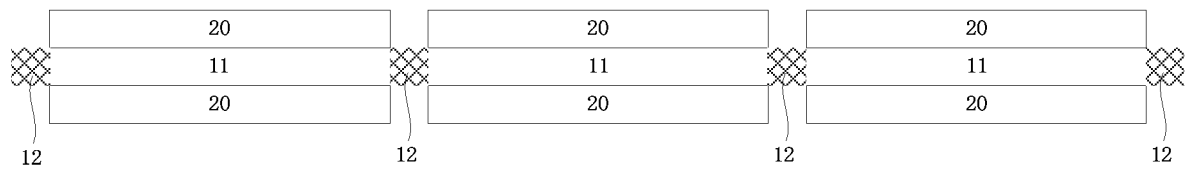
Figure 7:
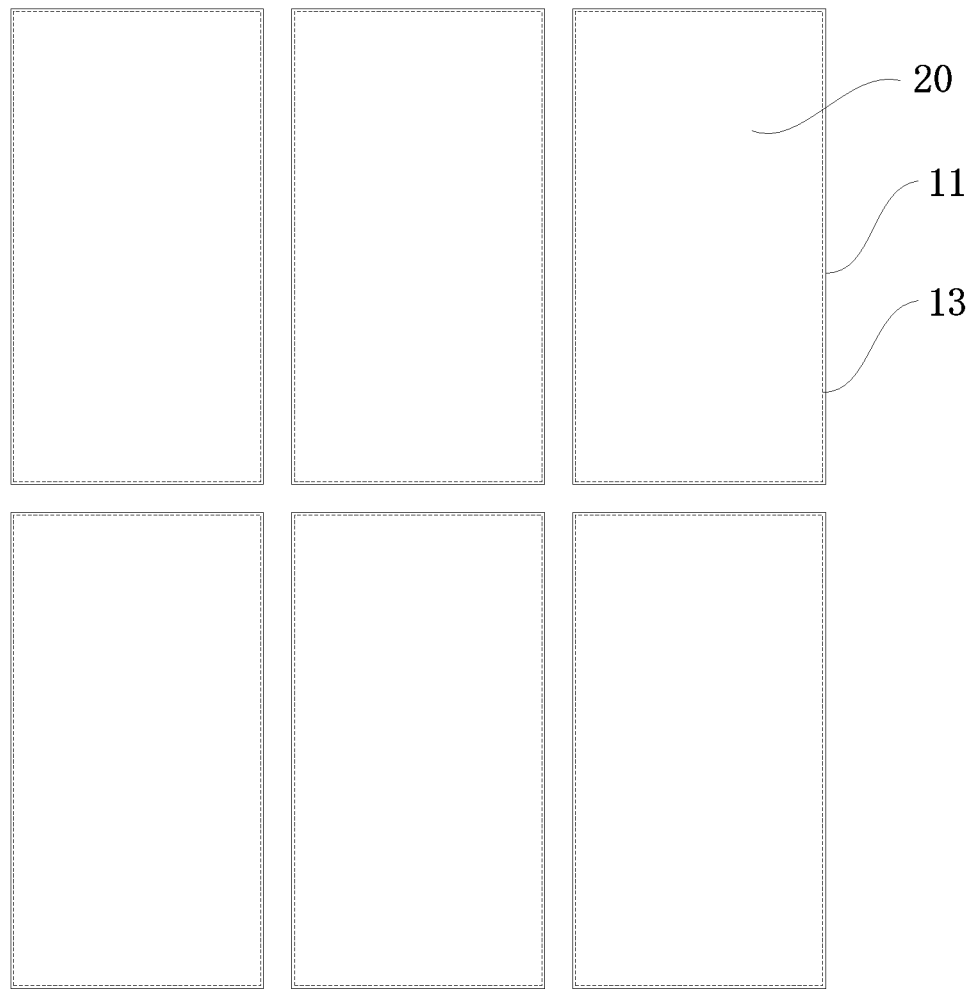
Figure 8:
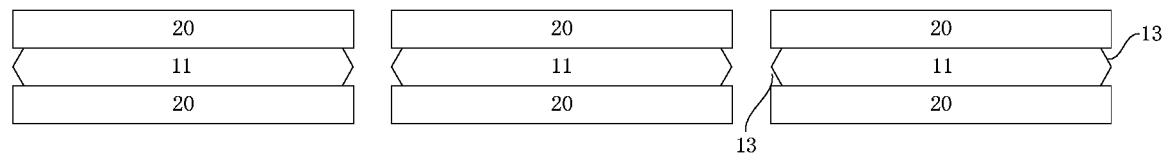

As shown in FIGS. 3 and 4, n substrate areas 11 and the skeleton area 12 surrounding the substrate areas 11 are preset on the glass base material 1, wherein n is greater than or equal to 2, and at least an etching protection layer 20 is formed on each of an upper surface and a lower surface of the substrate areas 11 of the glass base material 1, respectively. The etching protection layer 20 only covers the upper surface and the lower surface of each substrate area 11, an upper surface and a lower surface of the skeleton area 12 are both not covered by the etching protection layer 20. Therefore, the upper surface and the lower surface of the skeleton area 12 can be both etched at the same time during the following etching process, and a stress dissipation edge having a plurality of stress dissipation surfaces can be easily formed. The substrate areas 11 are arranged in a matrix arrangement on the glass base material 1, adjacent substrate areas 11 are separated from each other by the skeleton area 12.

As shown in FIGS. 5, 6, 7, 8, the skeleton area 12 of the glass base material 1 is etched, to separate the substrate areas 11 from the glass base material 1, and form a stress dissipation edge 13 along an edge of each substrate area 11. In an embodiment, by using a first etching process, the whole skeleton area 12 of the glass base material 1 is removed, and the substrate areas 11 protected by the etching protection layer 20 are reserved. The stress dissipation edge 13 is a blade edge, the stress dissipation edge 13 surrounds the edge of the substrate area 11, and a width of the stress dissipation edge 13 ranges from 5 um to 300 um.

Figure 9:
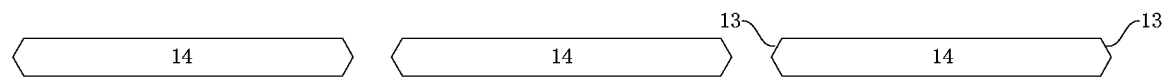

At last, as shown in FIG. 9, the etching protection layer 20 is removed to get independent glass substrates 14.

Figure 10:

As shown in FIG. 10, in an alternative embodiment, the stress dissipation edge 131 is a circular-arc edge, to dissipate stress along a plurality of different directions, and better prevent the glass substrate 14 from fragmentation.

Figure 11:

As shown in FIG. 11, in an alternative embodiment, the stress dissipation edge 132 is a triangle edge, to dissipate stress along a plurality of different directions, and better prevent the glass substrate 14 from fragmentation.

Figure 12:
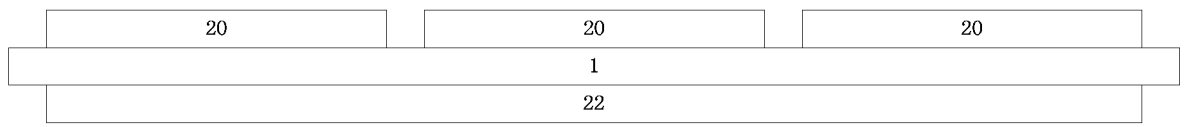
FIGS. 12-14 are schematic views of a second kind of manufacturing process of the method for manufacturing ultra-thin glass substrates of an embodiment of the present disclosure.
Figure 13:
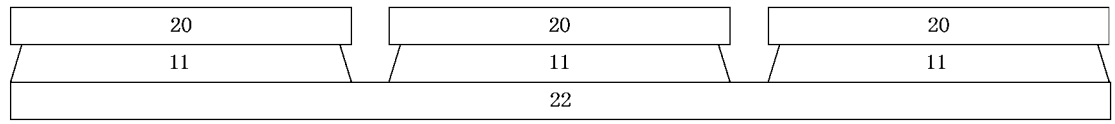
Figure 14:
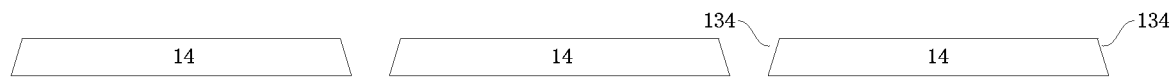

FIGS. 12-14 are schematic views of a second kind of manufacturing process of the method for manufacturing ultra-thin glass substrates of an embodiment of the present disclosure. As shown in FIGS. 12-14, in an alternative embodiment, based on the above manufacturing process, during the process of forming an etching protection layer on each of the upper layer and the lower layer of the substrate area 11, respectively, one side of the glass base material 1 is fully covered by the etching protection layer 22, on the other side of the glass base material 1, only the substrate areas 11 are covered by the etching protection layer 20, the skeleton area 12 is not covered by the etching protection layer 20. Therefore, during the etching process, the side of the glass base material 1 fully covered by the etching protection layer is not etched, only the other side is etched, to form a stress dissipation edge 133 in a sloped shape along an edge of each glass substrate 14.

Figure 15:
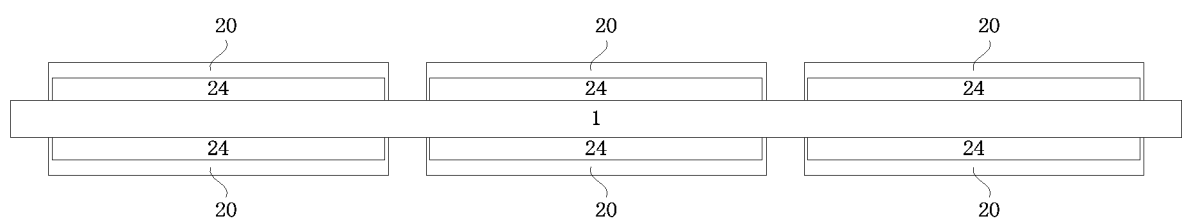
FIGS. 15-17 are schematic views of a third kind of manufacturing process of the method for manufacturing ultra-thin glass substrates of an embodiment of the present disclosure.
Figure 16:
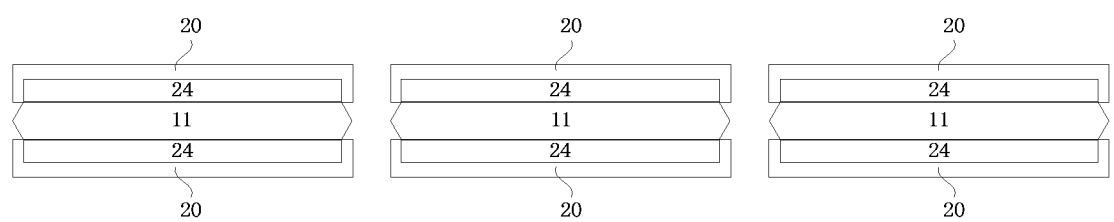
Figure 17:
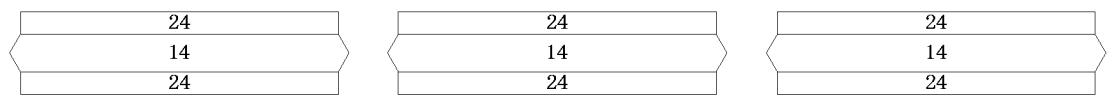

FIGS. 15-17 are schematic views of a third kind of manufacturing process of the method for manufacturing ultra-thin glass substrates of an embodiment of the present disclosure. As shown in FIGS. 15-17, in an alternative embodiment, based on the above manufacturing process, during the process of forming an etching protection layer on each of the upper layer and the lower layer of the substrate area 11, respectively, a polymeric reinforcing layer 24 is formed on at least one side of the upper surface and the lower surface of each substrate area 11 of the glass base material. The etching protection layer is formed on one side of polymeric reinforcing layer 24 away from the substrate areas 11, to get the glass substrates 14 at last, and the upper surface and the lower surface of the glass substrates 14 are covered by the polymeric reinforcing layer 24. Therefore, when the glass substrate 14 is bent and recovered, the flexibility of the whole glass substrate 14 is enhanced, and the glass substrate 14 can be better prevented from fragmentation.

In an alternative embodiment, based on the above manufacturing process, during the process of forming an etching protection layer on each of the upper layer and the lower layer of the substrate area 11, respectively, a panel function layer 23 is formed on at least one side of the upper surface and the lower surface of each substrate area 11 of the glass base material 1, wherein the panel function layer 23 includes one of a TFT rear panel, an organic light emitting layer, a touch detection layer, a fingerprint identification layer, and a cover plate or a combination thereof, and the etching protection layer is formed on one side of the panel function layer 23 away from the substrate areas 11.

Figure 18:
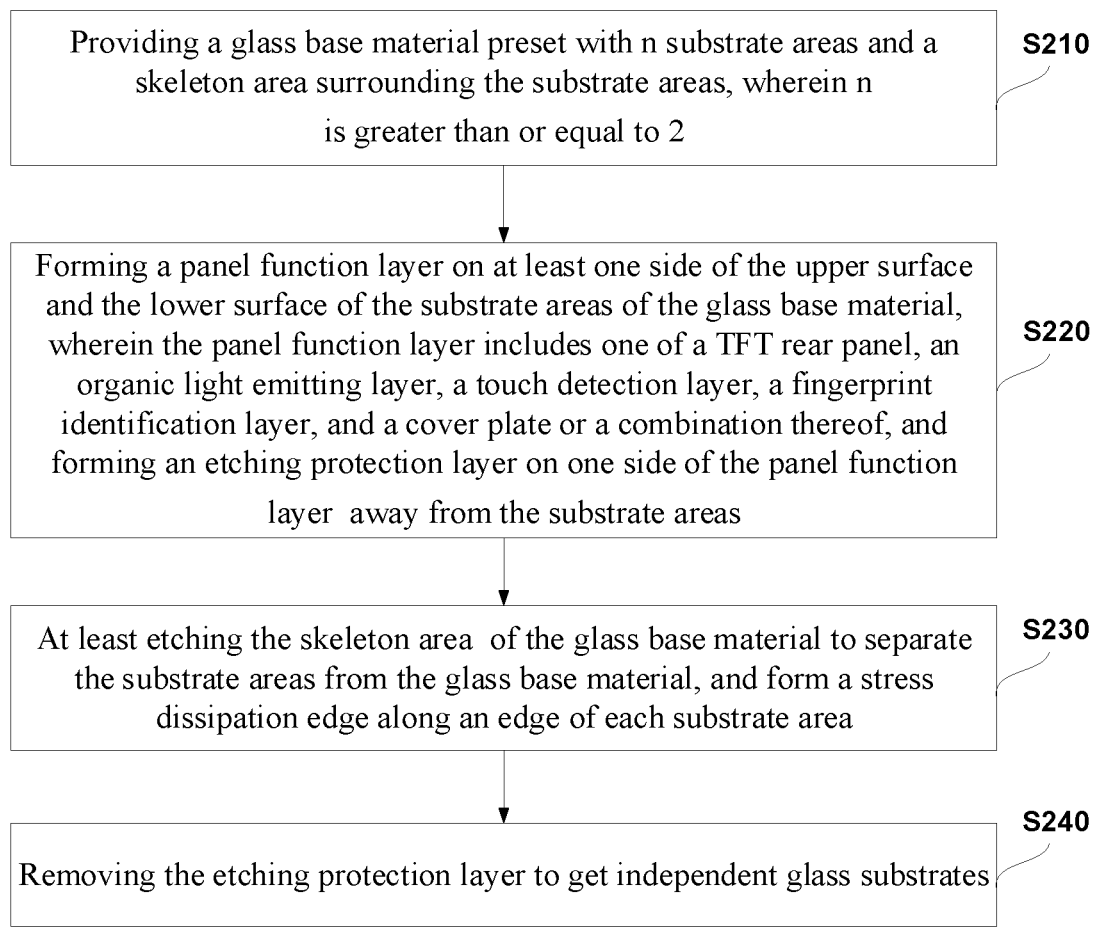
FIG. 18 is a flow chart showing a second kind of the method for manufacturing ultra-thin glass substrates of an embodiment of the present disclosure.

FIG. 18 is a flow chart showing a second kind of the method for manufacturing ultra-thin glass substrates of an embodiment of the present disclosure. As shown in FIG. 18, the method for manufacturing ultra-thin glass substrates includes following steps:

S210: providing a glass base material 1 preset with n substrate areas 11 and a skeleton area 12 surrounding the substrate areas 11, wherein n is greater than or equal to 2;

S220: forming a panel function layer 23 on at least one side of the upper surface and the lower surface of each substrate area 11 of the glass base material 1, wherein the panel function layer 23 includes one of a TFT rear panel, an organic light emitting layer, a touch detection layer, a fingerprint identification layer, and a cover plate or a combination thereof, and forming an etching protection layer on one side of the panel function layer 23 away from the substrate areas 11;

S230: at least etching the skeleton area 12 of the glass base material 1 to separate the substrate areas 11 from the glass base material 1, and form a stress dissipation edge 13 along an edge of each substrate area 11;

S240: removing the etching protection layer to get independent glass substrates 14.

During the manufacturing process of an embodiment of the present disclosure, scribing wheel and laser are not needed, therefore damage caused by scribing wheel cutting or laser cutting to quality of the ultra-thin glass substrates can be prevented. The panel function layer 23 can be formed directly on the substrate areas 11 of the glass base material 1 when acquiring the glass substrates 14 from the glass base material 1. Damage caused by scribing wheel cutting or laser cutting to the formed panel function layer 23 can also be prevented, time of following manufacturing process is saved, processing speed of the glass substrate 14 is accelerated, stress dissipation effects of the edges of the substrate areas 11 are enhanced, and the quality of the ultra-thin glass substrate is improved.

In an embodiment, the step S220 includes following steps:

S221: forming a polymeric reinforcing layer 24 on at least one side of the upper surface and the lower surface of each substrate area 11 of the glass base material;

S222: forming a panel function layer 23 on one side of the polymeric reinforcing layer 24 away from the substrate areas 11, wherein the panel function layer 23 at least includes a TFT rear panel, an organic light emitting layer and a touch detection layer stacked in sequence on the substrate areas 11, and forming an etching protection layer on one side of the panel function layer 23 away from the substrate areas 11. Therefore, when the glass substrate 14 is bent and recovered, the flexibility of the whole glass substrate 14 is enhanced, and the glass substrate 14 can be better prevented from fragmentation.

In an embodiment, the etching protection layer covers a surface of the panel function layer 23 away from the substrate areas 11 and four side surfaces of the panel function layer 23, but the present disclosure is not limited to this.

In an embodiment, by using a first etching process, the whole skeleton area 12 of the glass base material 1 is removed, and the substrate areas 11 protected by the etching protection layer are reserved; by using a second etching process, the stress dissipation edge 13 is formed along the edge of each substrate area 11, but the present disclosure is not limited to this.

In an embodiment, by using one etching process, the whole skeleton area 12 of the glass base material 1 is removed, and the stress dissipation edge 13 is formed along the edge of each substrate area 11, but the present disclosure is not limited to this.

In an embodiment, the etching protection layer only covers the upper surface and the lower surface of each substrate area 11, an upper surface and a lower surface of the skeleton area 12 are both not covered by the etching protection layer, but the present disclosure is not limited to this.

In an embodiment, one side of the glass base material 1 is fully covered by the etching protection layer, on the other side of the glass base material 1, only the substrate areas 11 are covered by the etching protection layer, and the skeleton area 12 is not covered by the etching protection layer, but the present disclosure is not limited to this.

In an embodiment, the substrate areas 11 are arranged in a matrix arrangement on the glass base material 1, adjacent substrate areas 11 are separated from each other by the skeleton area 12, but the present disclosure is not limited to this.

In an embodiment, the stress dissipation edge is a circular-arc edge, a blade edge, or a polygonal edge, the blade edge or the polygonal edge includes at least one straight hypotenuse or arcuate hypotenuse, an angle between the hypotenuse and the glass base material 1 ranges from 15° to 90, but the present disclosure is not limited to this.

In an embodiment, a thickness of the glass base material 1 ranges from 10 um to 150 um, but the present disclosure is not limited to this. The stress dissipation edge 13 surrounds the edge of each substrate area 11, and a width of the stress dissipation edge 13 ranges from 5 um to 300 um, but the present disclosure is not limited to this.

The present disclosure, per an embodiment, further provides a method for manufacturing a display panel, including the method for manufacturing ultra-thin glass substrates.

FIGS. 19-22 are schematic views of a fourth kind of manufacturing process of the method for manufacturing ultra-thin glass substrates of an embodiment of the present disclosure. As shown in FIGS. 19-22, the fourth kind of manufacturing process of the ultra-thin glass substrate 14 includes the following processes.

Figure 19:
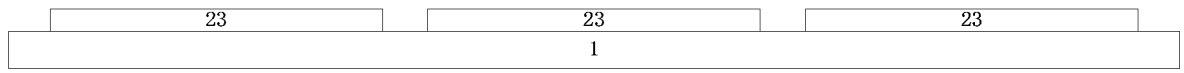
FIGS. 19-22 are schematic views of a fourth kind of manufacturing process of the method for manufacturing ultra-thin glass substrates of an embodiment of the present disclosure.
Figure 20:
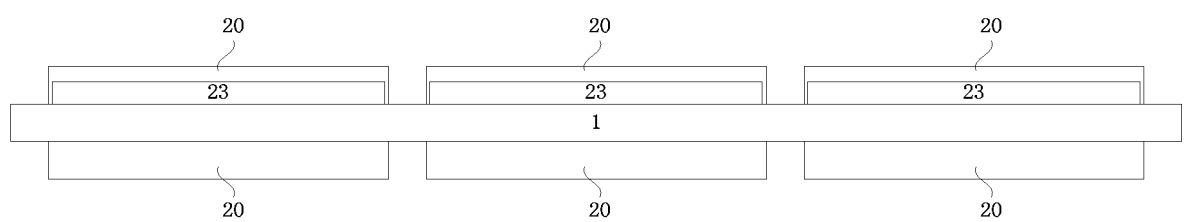

As shown in FIGS. 19 and 20, firstly a glass base material 1 is provided, n substrate areas 11 and a skeleton area 12 surrounding the substrate areas 11 are preset on the glass base material 1, wherein n is greater than or equal to 2. The width of the glass base material 1 ranges from 10 um to 150 um. The substrate areas 11 are arranged in a matrix arrangement on the glass base material 1, adjacent substrate areas 11 are separated from each other by the skeleton area 12. A panel function layer 23 is formed on an upper surface of the substrate area 11, the panel function layer 23 at least includes one of a TFT rear panel, an organic light emitting layer, a touch detection layer, a fingerprint identification layer, and a cover plate or a combination thereof. An etching protection layer 20 is formed on one side of the glass base material 1 without the panel function layer 23 and one side of the panel function layer 23 away from the substrate areas 11, respectively.

Figure 21:
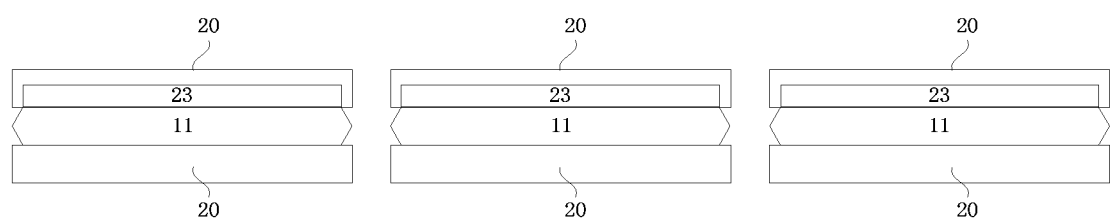

As shown in FIG. 21, at least the skeleton area 12 of the glass base material 1 is etched, to separate the substrate areas 11 from the glass base material 1, and form a stress dissipation edge 13 along an edge of each substrate area 11.

Figure 22:
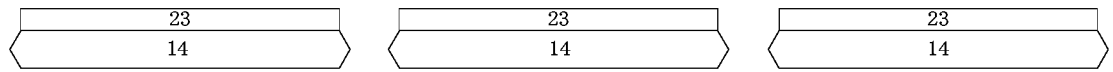

As shown in FIG. 22, the etching protection layer is removed to acquire independent glass substrates 14 having the panel function layer 23.

In an embodiment of the present disclosure, the panel function layer can be formed directly on a plurality of areas (corresponding to a plurality of display panels acquired in the following process) of the glass base material 1 when acquiring the glass substrates 14 from the glass base material 1. The time of the manufacturing process of the panel function layer is greatly saved. As scribing wheel and laser are not needed in the following process of separating the glass substrates 14, damage caused by scribing wheel cutting or laser cutting to the formed panel function layer 23 can be prevented, therefore processing speed of the display panel is accelerated, and product quality of the display panel is improved.

Figure 23:
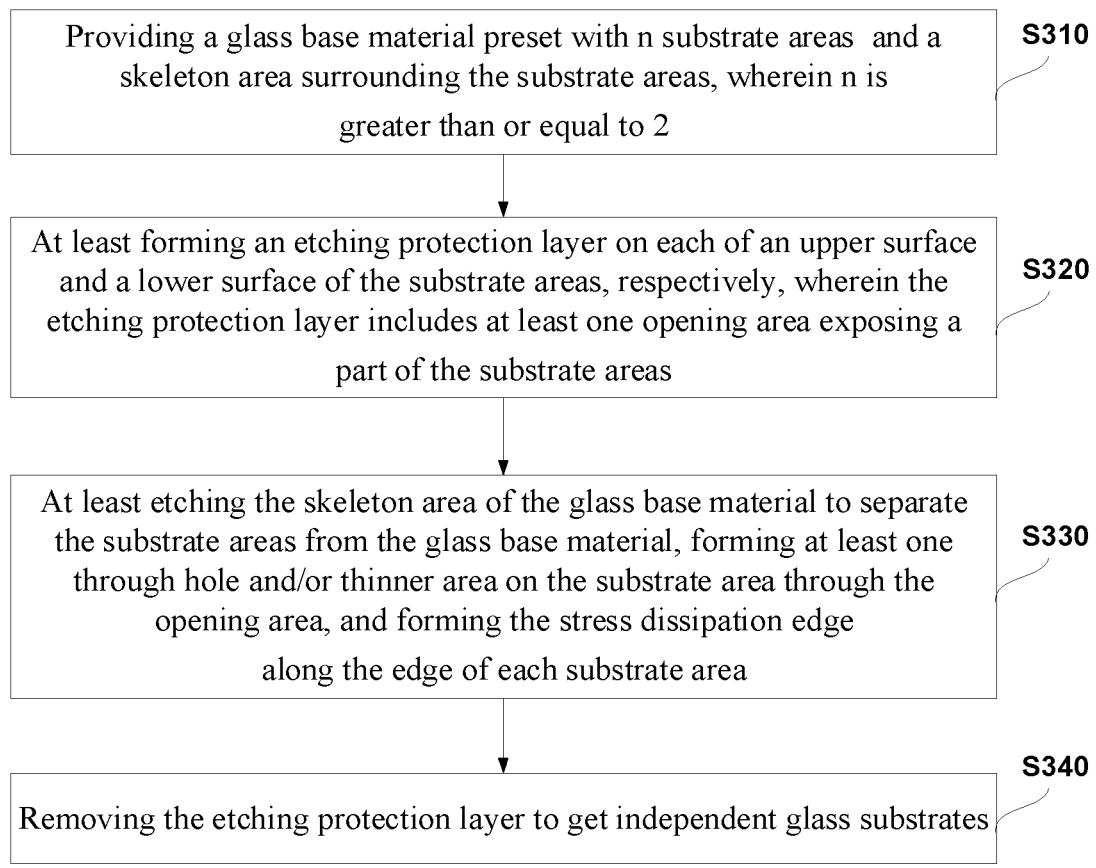
FIG. 23 is a flow chart showing a third kind of the method for manufacturing ultra-thin glass substrates of an embodiment of the present disclosure.

FIG. 23 is a flow chart showing a third kind of the method for manufacturing ultra-thin glass substrates. As shown in FIG. 23, the method for manufacturing ultra-thin glass substrates includes following steps:

S310: providing a glass base material 1 preset with n substrate areas 11 and a skeleton area 12 surrounding the substrate areas 11, wherein n is greater than or equal to 2;

S320: at least forming an etching protection layer on each of an upper surface and a lower surface of the substrate areas 11, respectively, wherein the etching protection layer includes at least one opening area exposing a part of the substrate areas 11;

S330: at least etching the skeleton area 12 of the glass base material 1 to separate the substrate areas 11 from the glass base material 1, forming at least one through hole and/or thinner area on the substrate area 11 through the opening area, and forming the stress dissipation edge 13 along the edge of each substrate area 11;

S340: removing the etching protection layer to get independent glass substrates 14.

During the manufacturing process of an embodiment of the present disclosure, scribing wheel and laser are not needed, therefore damage caused by scribing wheel cutting or laser cutting to quality of the ultra-thin glass substrates can be prevented. The through hole and/or the thinner area can be formed directly in a plurality of substrate areas 11 of the glass base material 1. The damage caused by laser drilling to the glass substrate 14 is also prevented, time of the following manufacturing process is saved, processing speed of the glass substrates is accelerated, stress dissipation effects of the edges of the substrate areas are enhanced, and quality of the ultra-thin glass substrate is improved.

In an embodiment, by using a first etching process, the whole skeleton area 12 of the glass base material 1 is removed, and the substrate areas 11 protected by the etching protection layer are reserved, but the present disclosure is not limited to this.

By using a second etching process, at least one through hole and/or thinner area is formed on each substrate area 11, and the stress dissipation edge 13 is formed along the edge of each substrate area 11, but the present disclosure is not limited to this.

In an embodiment, by using one etching process, the whole skeleton area 12 of the glass base material 1 is removed, at least one through hole and/or thinner area is formed on each substrate area 11, and the stress dissipation edge 13 is formed along the edge of each substrate area 11, but the present disclosure is not limited to this.

In an embodiment, the step S320 includes following steps:
- S321: forming a polymeric reinforcing layer 24 on at least one side of the upper surface and the lower surface of each substrate area 11 of the glass base material;
- S322: forming an etching protection layer on one side of the polymeric reinforcing layer 24 away from the substrate areas 11, wherein the etching protection layer includes at least one opening area exposing a part of the substrate areas 11. Therefore, when the glass substrate 14 is bent and recovered, the flexibility of the whole glass substrate 14 is enhanced, and the glass substrate 14 can be better prevented from fragmentation.

In an embodiment, the step S320 includes following steps:
- S323: forming a panel function layer 23 on at least one side of the upper surface and the lower surface of each substrate area 11 of the glass base material 1, wherein the panel function layer 23 includes one of a TFT rear panel, an organic light emitting layer, a touch detection layer, a fingerprint identification layer, and a cover plate or a combination thereof;
- S324: forming an etching protection layer on one side of the panel function layer 23 away from the substrate areas 11, wherein the etching protection layer includes at least one opening area exposing a part of the substrate areas 11.

In an embodiment, the substrate areas 11 are arranged in a matrix arrangement on the glass base material 1, adjacent substrate areas 11 are separated from each other by the skeleton area 12, but the present disclosure is not limited to this.

In an embodiment, the opening area is any one of a circular hole, an oval hole, a water drop-shaped hole and an irregular hole, but the present disclosure is not limited to this.

In an embodiment, the stress dissipation edge 13 is a circular-arc edge, a blade edge, or a polygonal edge, the blade edge or the polygonal edge includes at least one straight hypotenuse or arcuate hypotenuse, an angle between the hypotenuse and the glass base material 1 ranges from 15° to 90, but the present disclosure is not limited to this.

In an embodiment, a thickness of the glass base material 1 ranges from 10 um to 150 um, but the present disclosure is not limited to this. In an embodiment, the through hole is a camera installing hole 15. In an embodiment the thinner area cooperates with a fingerprint sensor.

The present disclosure, per an embodiment, further provides a method for manufacturing a display panel, including the method for manufacturing ultra-thin glass substrates. The through hole is used to install an acoustical sensor or an optical sensor, a lower surface of the thinner area is provided with a fingerprint sensor.

FIGS. 24-29 are schematic views of a fifth kind of manufacturing process of the method for manufacturing ultra-thin glass substrates of an embodiment of the present disclosure. As shown in FIGS. 24-29, the fifth kind of manufacturing process of the ultra-thin glass substrate 14 includes the following processes.

Figure 24:
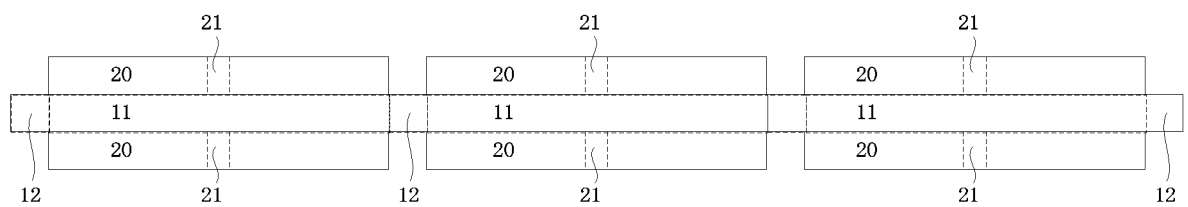
FIGS. 24-29 are schematic views of a fifth kind of manufacturing process of the method for manufacturing ultra-thin glass substrates of an embodiment of the present disclosure.
Figure 25:
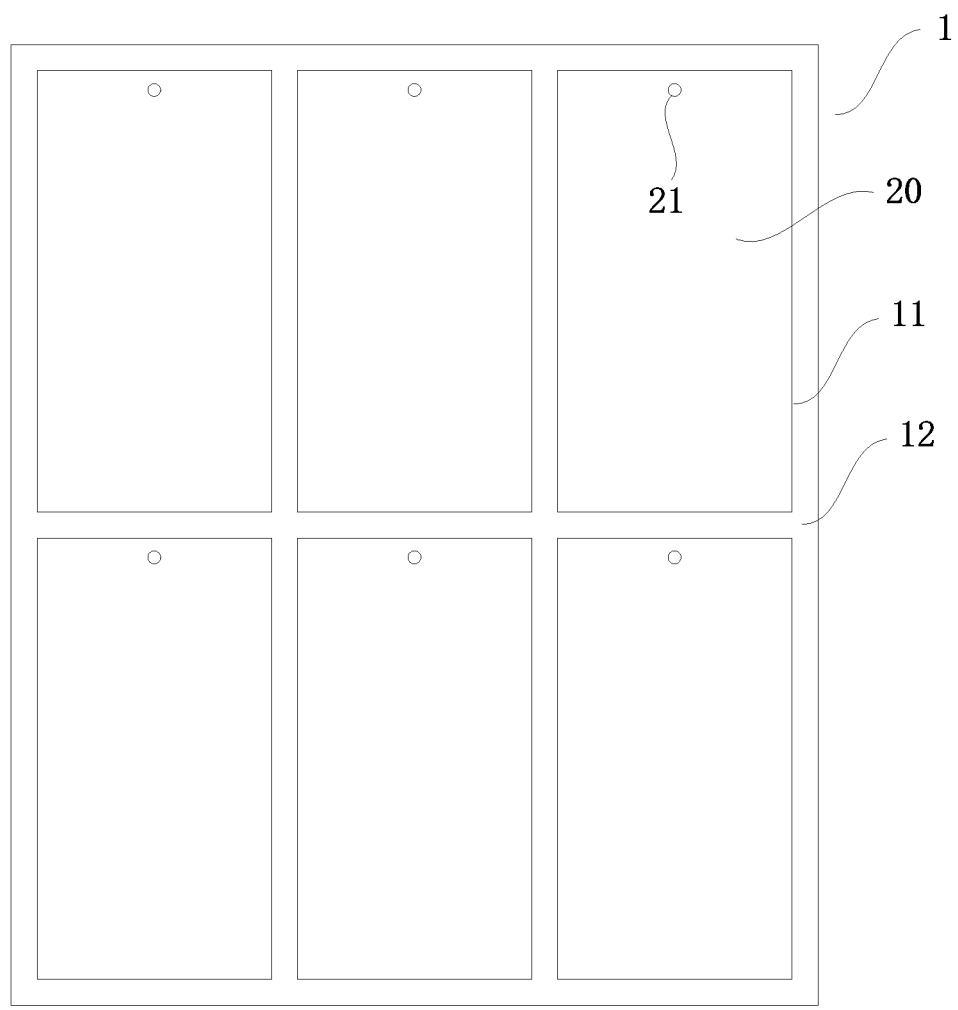

As shown in FIGS. 24 and 25, firstly, a glass base material 1 is provided, n substrate areas 11 and a skeleton area 12 surrounding the substrate areas 11 are preset on the glass base material 1, wherein n is greater than or equal to 2. The width of the glass base material 1 ranges from 10 um to 150 um. The substrate areas 11 are arranged in a matrix arrangement on the glass base material 1, adjacent substrate areas 11 are separated from each other by the skeleton area 12. At least an etching protection layer 20 is formed on each of the upper surface and the lower surface of the substrate area 11 of the glass base material 1, respectively. The etching protection layer includes at least one opening area exposing a part of the substrate areas 11. In the embodiment, the opening area is a circular hole.

Figure 26:
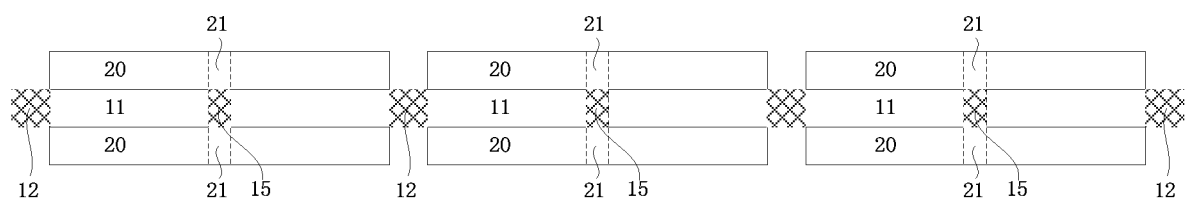
Figure 27:
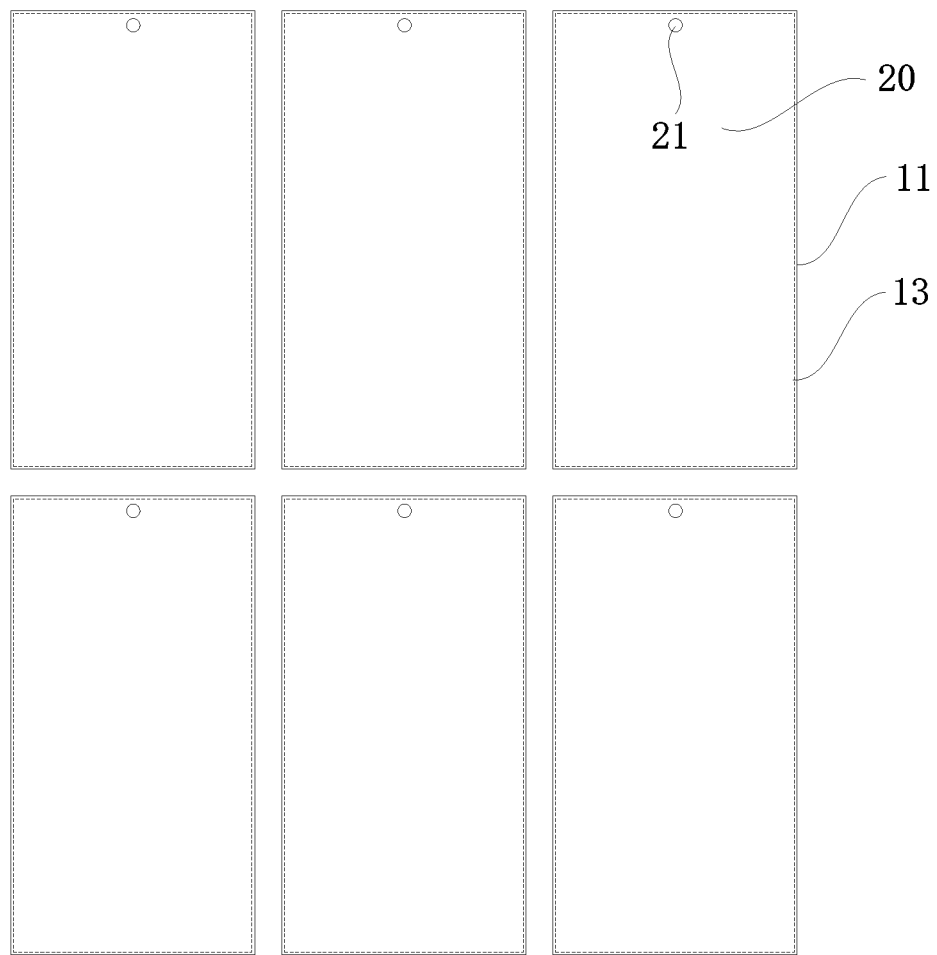

As shown in FIGS. 26 and 27, the skeleton area 12 of the glass base material 1 is etched, to separate the substrate areas 11 from the glass base material 1, a camera installing hole 15 is formed on each substrate area 11 through the opening area, and a stress dissipation edge 13 is formed along an edge of each substrate area 11.

Figure 28:
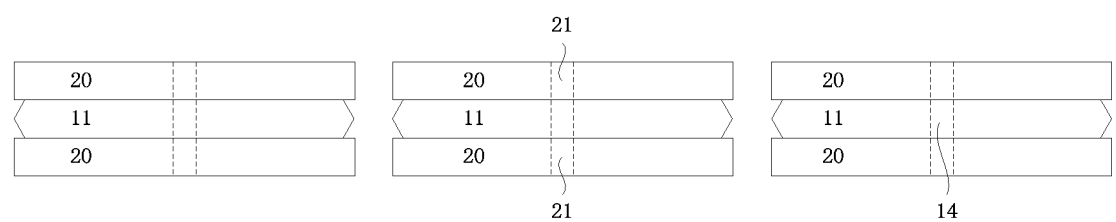
Figure 29:
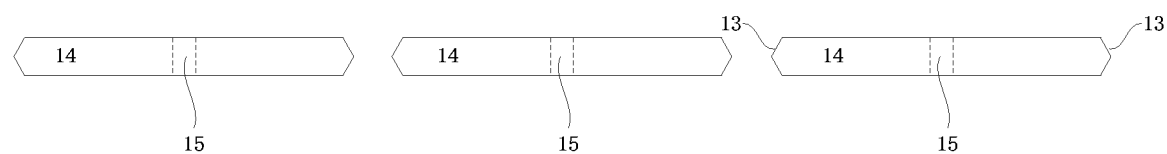

As shown in FIGS. 28 and 29, the etching protection layer 20 is removed to acquire independent glass substrates 14 having the camera installing hole 15.

In an embodiment of the present disclosure, the glass base material 1 can be drilled to form the through hole when acquiring the glass substrates 14 from the glass base material 1, to facilitate the installation of the acoustical sensor or the optical sensor in the following process. Time of processing the function layer is saved. The damage caused by laser drilling to the glass substrate 14 can be prevented. Time of the following manufacturing process is greatly saved, processing steps to acquire a glass substrate 14 having a panel function layer 23 are simplified, processing speed of the display panel is accelerated, stress dissipation effects of the edge of the ultra-thin glass are enhanced, and product quality of the display panel is improved.

Figure 30:
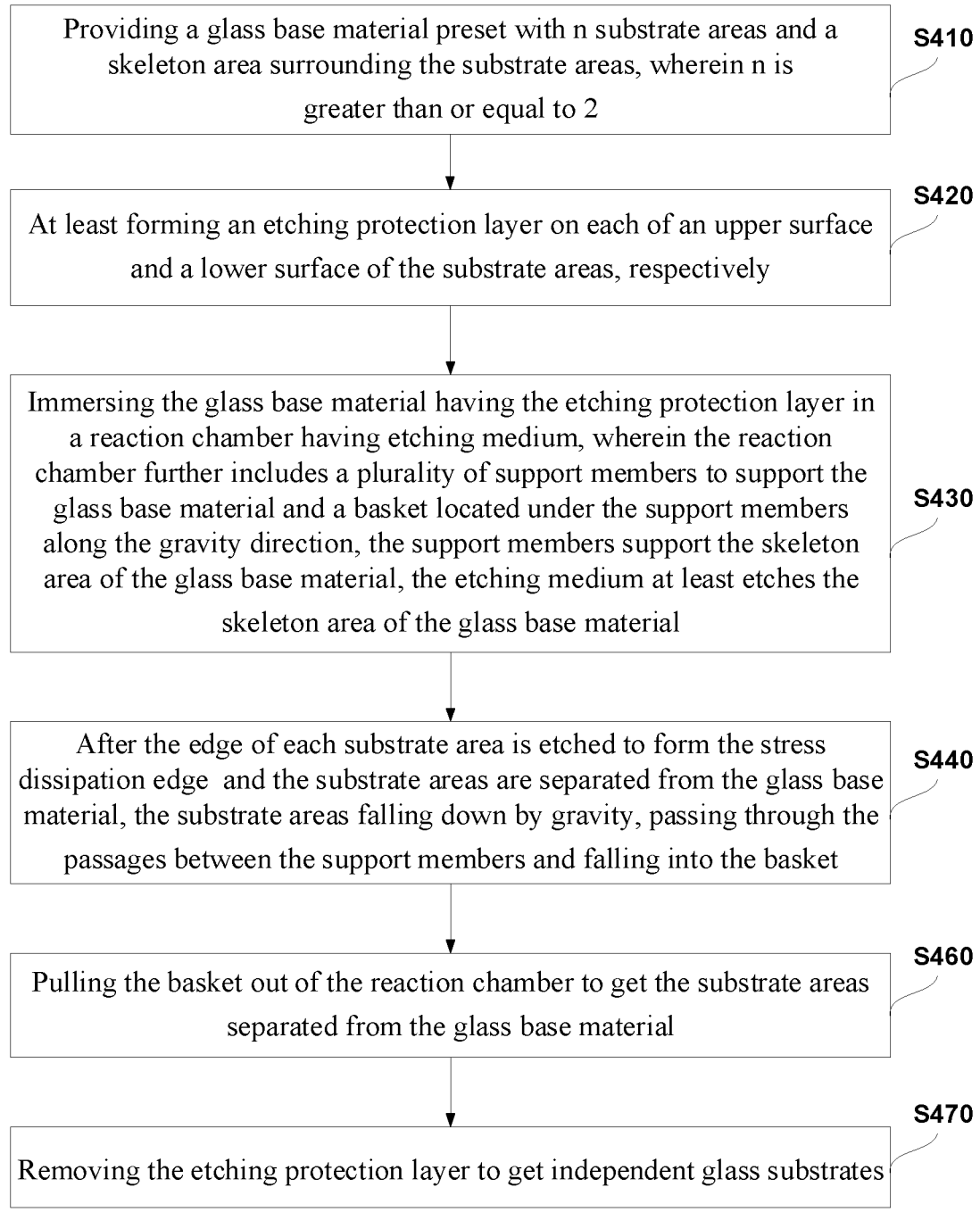
FIG. 30 is a flow chart showing a fourth kind of the method for manufacturing ultra-thin glass substrates of an embodiment of the present disclosure.

FIG. 30 is a flow chart showing a fourth kind of an embodiment of the method for manufacturing ultra-thin glass substrates. As shown in FIG. 30, the method for manufacturing ultra-thin glass substrates includes following steps:
- S410: providing a glass base material 1 preset with n substrate areas 11 and a skeleton area 12 surrounding the substrate areas 11, wherein n is greater than or equal to 2;
- S420: at least forming an etching protection layer on each of an upper surface and a lower surface of the substrate areas 11, respectively;
- S430: immersing the glass base material 1 having the etching protection layer in a reaction chamber having etching medium, wherein the reaction chamber further includes a plurality of support members 4 to support the glass base material 1 and a basket 5 located under the support members 4 along the gravity direction, the support members 4 support the skeleton area 12 of the glass base material 1, the etching medium at least etches the skeleton area 12 of the glass base material 1;
- S440: after the edge of each substrate area 11 is etched to form the stress dissipation edge 13 and the substrate areas 11 are separated from the glass base material 1, the substrate areas 11 falling down by gravity, passing through the passages between the support members 4 and falling into the basket 5;

S450: detecting whether all the substrate areas 11 are separated from the glass base material 1 and fall into the basket 5, if yes, then processing the step S460, if not, then processing the step S450;

S460: pulling the basket 5 out of the reaction chamber to get the substrate areas 11 separated from the glass base material 1;

S470: removing the etching protection layer to get independent glass substrates 14.

In an embodiment of the present disclosure, the support members 4 are used to support the skeleton area 12 of the glass base material 1, so that the substrate areas 11 fall into the basket 5 by gravity after being separated from the glass base material 1 by etching, and the basket 5 can take out all the glass substrates 14 at one time. Scribing wheel and laser are not needed, therefore damage caused by scribing wheel cutting or laser cutting to quality of the ultra-thin glass substrates can be prevented, steps of manufacturing the glass substrates are simplified, processing speed of the glass substrates is accelerated, stress dissipation effects of the edges of the substrate areas are reinforced, and the quality of the ultra-thin glass substrate is improved, per certain embodiments.

In an embodiment, the support members 4 only support the skeleton area 12 of the glass base material 1, the basket 5 has through holes used for the support members 4 passing through, a first projection area of each gap between the support members 4 on the basket 5 is larger than or equal to a second projection area of each substrate area 11 on the basket 5.

In an embodiment, the etching protection layer only covers the upper surface and the lower surface of each substrate area 11, an upper surface and a lower surface of the skeleton area 12 are both not covered by the etching protection layer.

In an embodiment, the step S420 includes following steps:

S421: forming a polymeric reinforcing layer 24 on at least one side of the upper surface and the lower surface of each substrate area 11 of the glass base material;

S422: forming an etching protection layer on one side of the polymeric reinforcing layer 24 away from the substrate areas 11, but the present disclosure is not limited to this.

In an embodiment, the step S420 includes following steps:

S423: forming a panel function layer 23 on at least one side of the upper surface and the lower surface of each substrate area 11 of the glass base material 1, wherein the panel function layer 23 includes one of a TFT rear panel, an organic light emitting layer, a touch detection layer, a fingerprint identification layer, and a cover plate or a combination thereof;

S424: forming an etching protection layer on one side of the panel function layer 23 away from the substrate areas 11, but the present disclosure is not limited to this.

In an embodiment, by using a first etching process, the whole skeleton area 12 of the glass base material 1 is removed, and the substrate areas 11 protected by the etching protection layer are reserved; by using a second etching process, the stress dissipation edge 13 is formed along the edge of each substrate area 11, but the present disclosure is not limited to this.

In another alternative embodiment, by using one etching process, the whole skeleton area 12 of the glass base material 1 is removed, and the stress dissipation edge 13 is formed along the edge of each substrate area 11, but the present disclosure is not limited to this.

In an embodiment, the substrate areas 11 are arranged in a matrix arrangement on the glass base material 1, adjacent substrate areas 11 are separated from each other by the skeleton area 12, but the present disclosure is not limited to this.

In an embodiment, the stress dissipation edge 13 is a circular-arc edge, a blade edge, or a polygonal edge, the blade edge or the polygonal edge includes at least one straight hypotenuse or arcuate hypotenuse, and an angle between the hypotenuse and the glass base material 1 ranges from 15° to 90°, but the present disclosure is not limited to this.

In an embodiment, a thickness of the glass base material 1 ranges from 10 um to 150 um, but the present disclosure is not limited to this.

The stress dissipation edge 13 surrounds the edge of each substrate area 11, and a width of the stress dissipation edge 13 ranges from 5 um to 300 um, but the present disclosure is not limited to this.

In an embodiment, after the step S470, the method further includes a step S480: forming a polymeric reinforcing layer on at least one side of an upper surface and a lower surface of the glass substrate 14, wherein components of the polymeric reinforcing layer 24 include acrylic, organic polymer material containing silicon, epoxy resin, fluororesin, polyamide, polyimide, polycarbonate, polyethylene terephthalate and poly-1,4-cyclohexanedimethyl terephthalate.

The present disclosure, per an embodiment, further provides a method for manufacturing a display panel, including the method for manufacturing ultra-thin glass substrates.

FIGS. 31-35 are schematic views of a sixth kind of manufacturing process of an embodiment of the method for manufacturing ultra-thin glass substrates of the present disclosure. As shown in FIGS. 31-35, the sixth kind of manufacturing process of the ultra-thin glass substrate 14 includes following processes.

Figure 31:
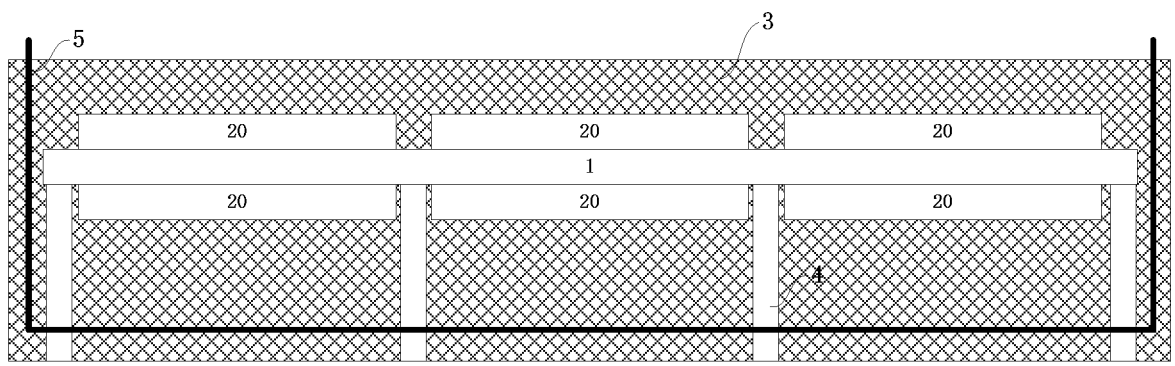
FIGS. 31-35 are schematic views of a sixth kind of manufacturing process of the method for manufacturing ultra-thin glass substrates of an embodiment of the present disclosure.

As shown in FIG. 31, firstly, a glass base material 1 is provided, n substrate areas 11 and a skeleton area 12 surrounding the substrate areas 11 are preset on the glass base material 1, wherein n is greater than or equal to 2. The width of the glass base material 1 ranges from 10 um to 150 um. The substrate areas 11 are arranged in a matrix arrangement on the glass base material 1, adjacent substrate areas 11 are separated from each other by the skeleton area 12. At least an etching protection layer is formed on each of the upper surface and the lower surface of the substrate area 11 of the glass base material 1, respectively. The glass base material 1 is immersed in a reaction chamber having etching medium 3.

Figure 32:
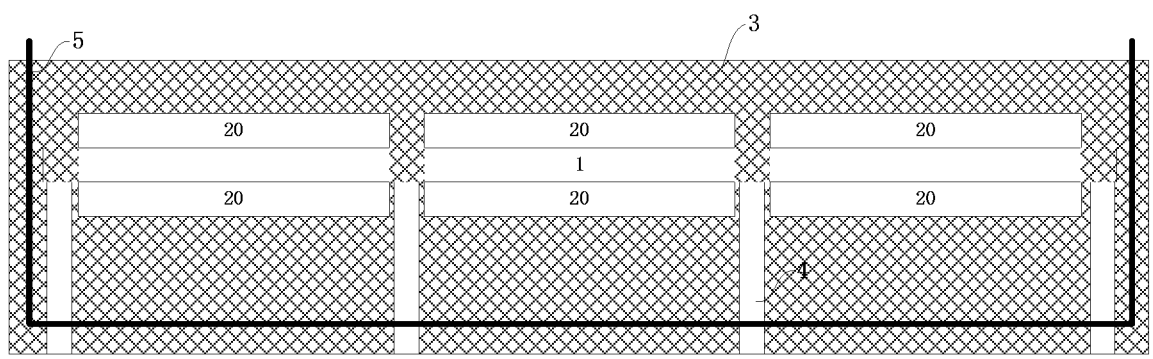

As shown in FIG. 32, the glass base material 1 having the etching protection layers is immersed into a reaction chamber having the etching medium 3. The reaction chamber further includes a plurality of support members 4 to support the glass base material 1 and a basket 5 located under the support members 4 along the gravity direction, the support members 4 support the skeleton area 12 of the glass base material 1, the etching medium at least etches the skeleton area 12 of the glass base material 1. The support members 4 only support the skeleton area 12 of the glass base material 1, the basket 5 has through holes used for the support members 4 passing through, a first projection area of each gap between the support members 4 on the basket 5 is larger than or equal to a second projection area of each substrate area 11 on the basket 5. The etching protection layer only covers the upper surface and the lower surface of each substrate area 11, an upper surface and a lower surface of the skeleton area 12 are both not covered by the etching protection layer.

Figure 33:
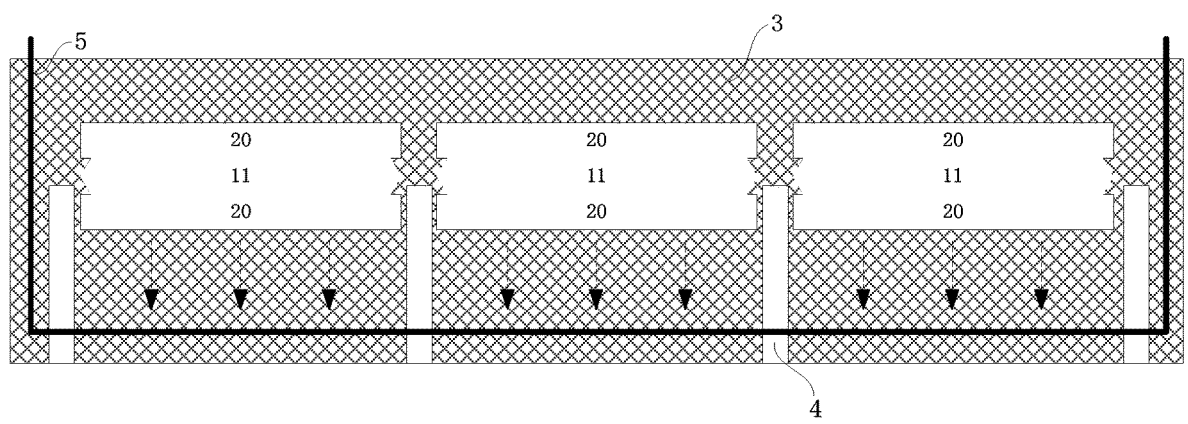
Figure 34:
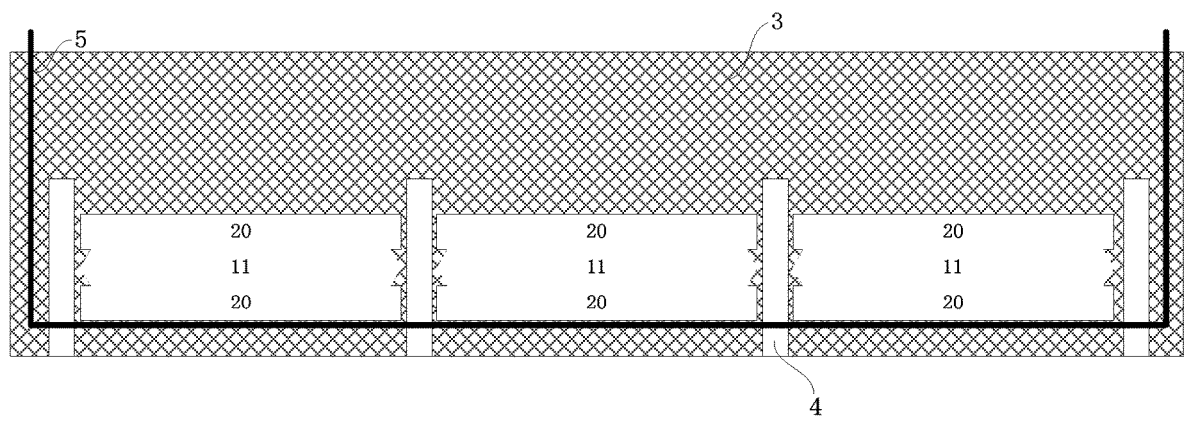

As shown in FIGS. 33 and 34, when the edge of the substrate area 11 is etched to form the stress dissipation edge 13 and the substrate area 11 is separated from the glass base material 1, the substrate areas 11 fall down by gravity, pass through the passages between the support members 4, respectively, and fall into the basket 5. Then whether all the substrate areas 11 are separated from the glass base material 1 and fall into the basket 5 are detected, if yes, then perform the following step of pulling out the basket 5.

Figure 35:
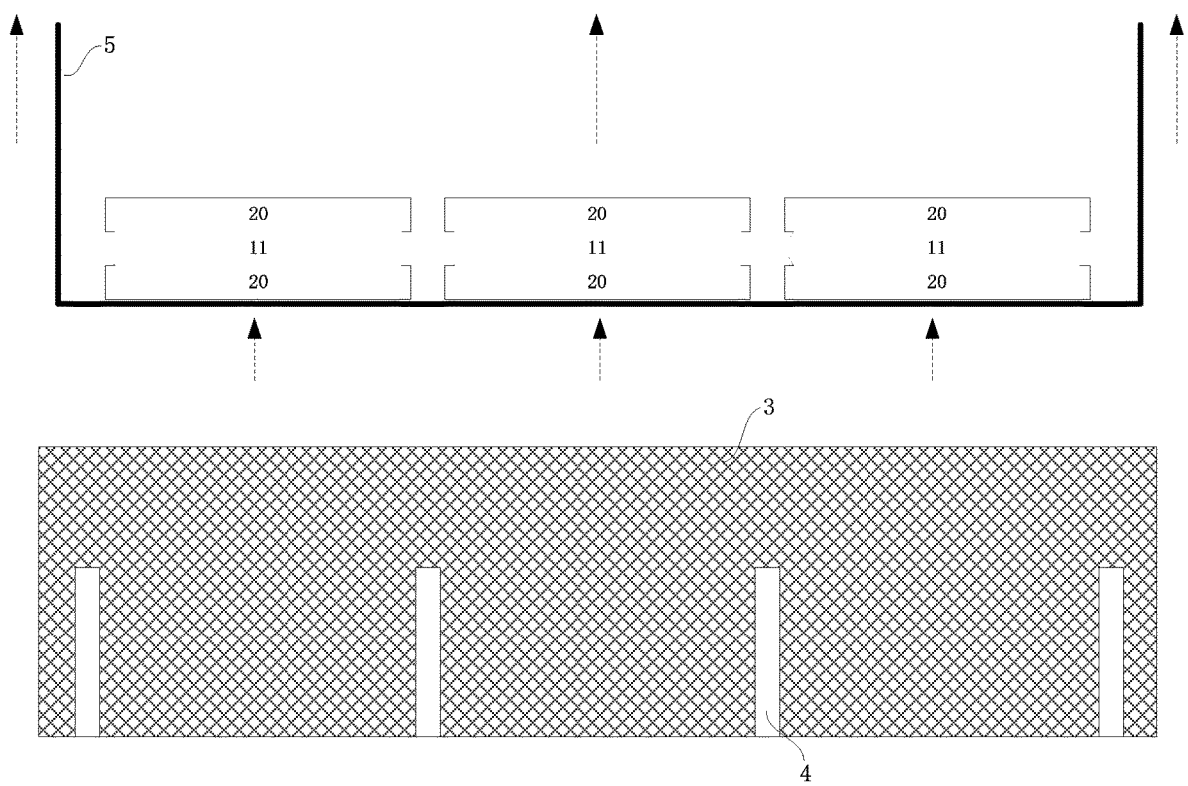

As shown in FIG. 35, the basket 5 is pulled out of the reaction chamber, and the substrate areas 11 separated from the glass base material 1 are pulled out together with the basket 5, then the etching protection layer is removed to get independent glass substrates 14.

According to at least some embodiments, the present disclosure is aimed to provide a method for manufacturing ultra-thin glass substrates, to prevent quality of the ultra-thin glass substrate from damage caused by scribing wheel cutting or laser cutting, steps of manufacturing the glass substrate are simplified, processing speed of the glass substrate is accelerated, stress dissipation effects of the edges of the substrate areas are enhanced, and the quality of the ultra-thin glass substrate is improved.

The above is a detailed description of the present disclosure in connection with the specific preferred embodiments, and the specific embodiments of the present disclosure are not limited to the description. Modifications and substitutions can be made without departing from the spirit and scope of the present disclosure.

As used herein, the terms "general," "generally," and "approximately" are intended to account for the inherent degree of variance and imprecision that is often attributed to, and often accompanies, any design and manufacturing process, including engineering tolerances, and without deviation from the relevant functionality and intended outcome, such that mathematical precision and exactitude is not implied and, in some instances, is not possible.

All the features and advantages, including structural details, spatial arrangements and method steps, which follow from the claims, the description and the drawing can be fundamental to the invention both on their own and in different combinations. It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A method for manufacturing ultra-thin glass substrates, comprising the following steps:
    S410: providing a glass base material preset with n substrate areas and a skeleton area surrounding the substrate areas, wherein n is greater than or equal to 2;
    S420: at least forming an etching protection layer on each of an upper surface and a lower surface of the substrate areas of the glass base material, respectively;
    S430: immersing the glass base material having the etching protection layer in a reaction chamber having etching medium, wherein the reaction chamber further includes a plurality of support members to support the glass base material and a basket located under the support members along gravity direction, the support members support the skeleton area of the glass base material, and the etching medium at least etches the skeleton area of the glass base material;
    S440: after an edge of each substrate area is etched to form a stress dissipation edge and the substrate areas are separated from the glass base material, the substrate areas falling down by gravity, passing through passages between the support members and falling into the basket;
    S460: pulling the basket out of the reaction chamber to get the substrate areas separated from the glass base material;
    S470: removing the etching protection layer to get independent glass substrates.

2. The method of claim 1, wherein, the support members only support the skeleton area of the glass base material, the basket has through holes used for the support members passing through, a first projection area of each gap between the support members on the basket is larger than or equal to a second projection area of each substrate area on the basket.

3. The method of claim 1, wherein, the etching protection layer only covers the upper surface and the lower surface of each substrate area, an upper surface and a lower surface of the skeleton area are both not covered by the etching protection layer.

4. The method of claim 1, wherein, the step S420 comprises the following steps:
    S421: forming a polymeric reinforcing layer on at least one side of the upper surface and the lower surface of each substrate area of the glass base material, wherein components of the polymeric reinforcing layer comprise acrylic, organic polymer material containing silicon, epoxy resin, fluororesin, polyamide, polyimide, polycarbonate, polyethylene terephthalate and poly-1,4-cyclohexanedimethyl terephthalate;
    S422: forming the etching protection layer on one side of the polymeric reinforcing layer away from the substrate areas.

5. The method of claim 1, wherein, the step S420 comprises the following steps:
    S423: forming a panel function layer on at least one side of the upper surface and the lower surface of each substrate area of the glass base material, wherein the panel function layer comprises one of a TFT rear panel, an organic light emitting layer, a touch detection layer, a fingerprint identification layer, and a cover plate or a combination thereof;
    S424: forming an etching protection layer on one side of the panel function layer away from the substrate areas.

6. The method of claim 1, wherein, by using a first etching process, the whole skeleton area of the glass base material is removed, and the substrate areas protected by the etching protection layer are reserved;

by using a second etching process, the stress dissipation edge is formed along the edge of each substrate area;

or, by using one etching process, the whole skeleton area of the glass base material is removed, and the stress dissipation edge is formed along the edge of each substrate area.

7. The method of claim 1, wherein, the substrate areas are arranged in a matrix arrangement on the glass base material, adjacent substrate areas are separated from each other by the skeleton area;

the stress dissipation edge is a circular-arc edge, a blade edge, or a polygonal edge, the blade edge or the polygonal edge comprises at least one straight hypotenuse or arcuate hypotenuse, an angle between the hypotenuse and the glass base material ranges from 15° to 90;

a thickness of the glass base material ranges from 10 μm to 150 um;

the stress dissipation edge surrounds the edge of each substrate area, and a width of the stress dissipation edge ranges from 5 μm to 300 um.

8. The method of claim 1, wherein, the following step is performed after the step S440, and before the step S460:

S450: detecting whether all the substrate areas are separated from the glass base material and fall into the basket, if yes, then processing the step S460, if not, then processing the step S450.

9. The method of claim 1, wherein, the method further comprises a step S480 after the step S470: forming a polymeric reinforcing layer on at least one side of an upper surface and a lower surface of the glass substrate, wherein components of the polymeric reinforcing layer comprise acrylic, organic polymer material containing silicon, epoxy resin, fluororesin, polyamide, polyimide, polycarbonate, polyethylene terephthalate and poly-1,4-cyclohexanedimethyl terephthalate.

10. A method for manufacturing a display panel, comprising the method for manufacturing ultra-thin glass substrates of claim 1.

* * * * *